(12) United States Patent
Greco

(10) Patent No.: US 7,207,449 B1
(45) Date of Patent: Apr. 24, 2007

(54) ANTI-STATIC STORAGE SHELVES AND ASSEMBLY

(76) Inventor: David F. Greco, 68 Shingle Mill Rd., Harwinton, CT (US) 06791

( * ) Notice: Subject to any disclaimer, the term of this patent is extended or adjusted under 35 U.S.C. 154(b) by 769 days.

(21) Appl. No.: 10/382,949

(22) Filed: Mar. 6, 2003

(51) Int. Cl.
*A47F 5/00* (2006.01)
(52) U.S. Cl. .................................... 211/134
(58) Field of Classification Search ........... 211/134, 211/26; 361/212
See application file for complete search history.

(56) References Cited

U.S. PATENT DOCUMENTS

| 3,258,650 A | * | 6/1966 | Fiege | 361/801 |
| 4,563,722 A | | 1/1986 | Maroney et al. | |
| 4,699,270 A | * | 10/1987 | Bohm | 312/107 |
| 5,008,779 A | * | 4/1991 | Salmon | 361/797 |

* cited by examiner

*Primary Examiner*—Sarah Purol
(74) *Attorney, Agent, or Firm*—Sheldon H. Parker

(57) ABSTRACT

An anti-static storage assembly including a shelf unit, grounding system, and cabinet for safe storage of circuit boards wherein each shelf mounted in the cabinet is independent of any other shelf in the cabinet.

28 Claims, 16 Drawing Sheets

ANTI-STATIC STORAGE SHELVES AND ASSEMBLY

FIELD OF INVENTION

The present invention relates generally to an anti-static storage shelf, and more particularly to an anti-static storage shelf including a grounding system for use with a cabinet to store circuit boards.

BACKGROUND OF THE INVENTION

Circuit boards are very susceptible to static damage. Static electricity creates a voltage higher than the transmitters of a circuit board can handle, thereby destroying a chip or chips on the circuit board. When a circuit board blows, it is very difficult to determine or fix the chip affected; hence, the entire circuit board must be removed for repair or replacement. Accordingly, it is very important for circuit board storage facilities to be grounded and as static-free as possible.

Circuit boards are usually stored in large shelved cabinets having some sort of anti-static properties and a grounding system; however most of these cabinets are built having the cabinet itself as a major factor in the grounding system. These grounding cabinet structures, which can weigh around 500 pounds, are very large and heavy, making them difficult to transport. Disassembling these cabinets for transportation is not an option since the cabinet is of welded construction and the outside metal of the cabinet is an essential element of the grounding system. Additionally, the complete 500-pound cabinet must be painted to avoid rusting. Not many manufacturers are equipped to move and paint such a large and heavy cabinet. Before painting, several points on the cabinet must be masked off so that paint will not interfere with the conductivity between the stainless steel shelf supports and the outside shell metal. The masked metal is at several of the rivet points that hold the stainless steel supports. This raw, unpainted metal could eventually rust and could lead to a failure of conductivity between the stainless and outer shell. Dirt buildup or loose rivets could also lead to the same sort of failure.

Previous circuit board storage cabinets include making shelves of a static-dissipative plastic mold and adding these shelves to an adjustable track inside a storage cabinet having a grounding system dependant on conductivity of the outside metal shell. These all-plastic shelves do not add conductivity to the grounding system. Additionally, the plastic shelves are not very strong—definitely not as strong as metal. The plastic could bend or disfigure under a heavy weight, and large circuit boards are getting heavier. Several heavy circuit boards on one plastic shelf could potentially bend, disfigure, or break it. These plastic shelves are made of a glass-filled plastic material. While this material is strong, its static-dissipative properties may vary from one point to another on the shelf. Further, previous circuit board storage shelves are dependent upon one another, i.e. to make one shelf taller, the adjacent shelf must be made shorter.

The present invention overcomes the problems of previous anti-static shelves for circuit board storage.

Figure 1:
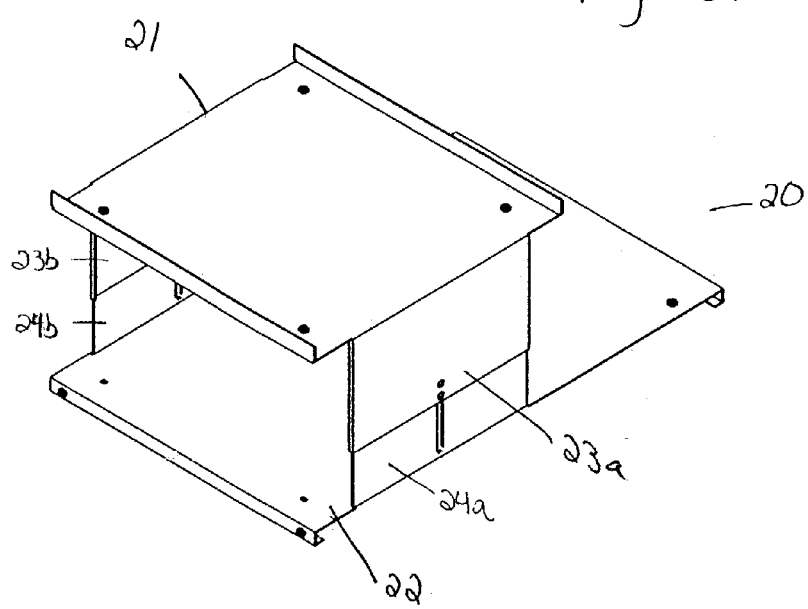
Figure 2:
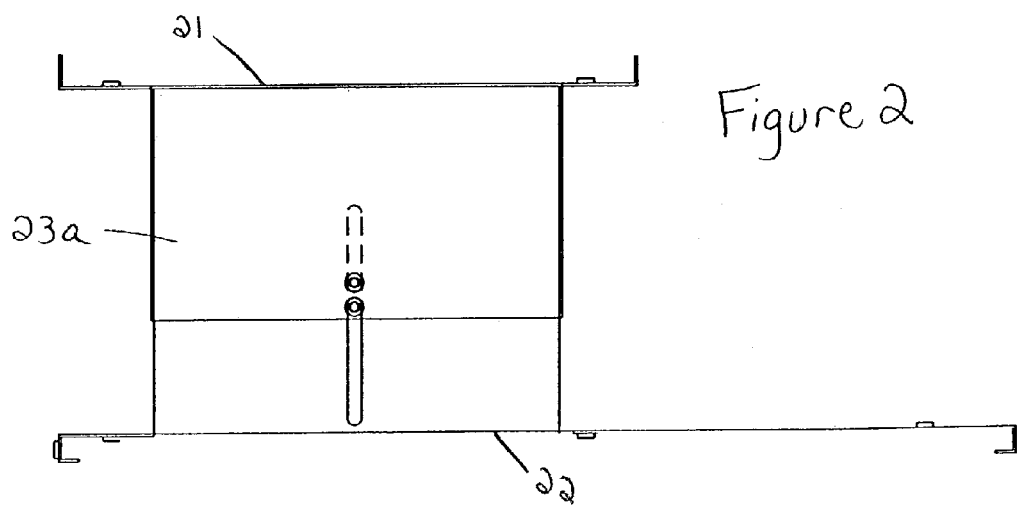
Figure 4:
Figure 3:
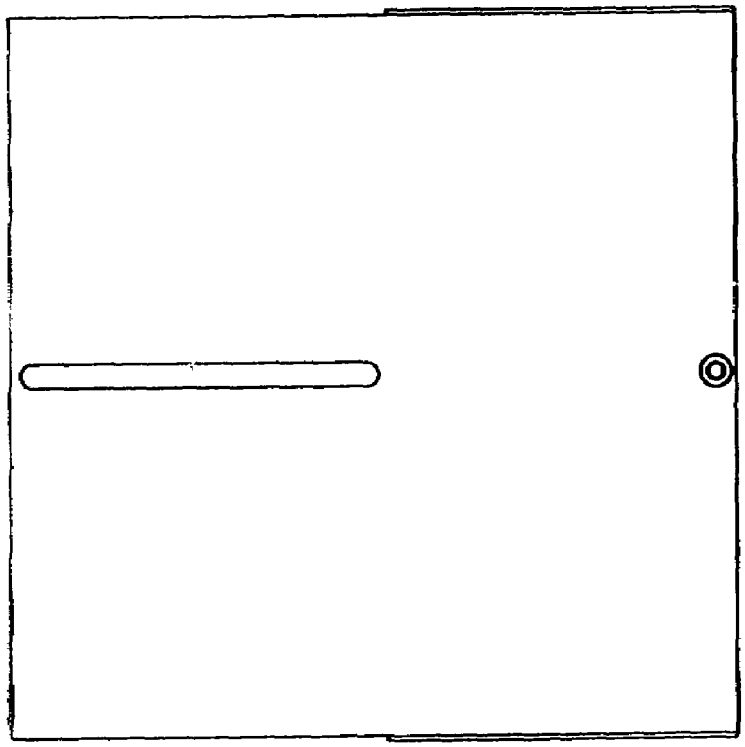
Figure 5:
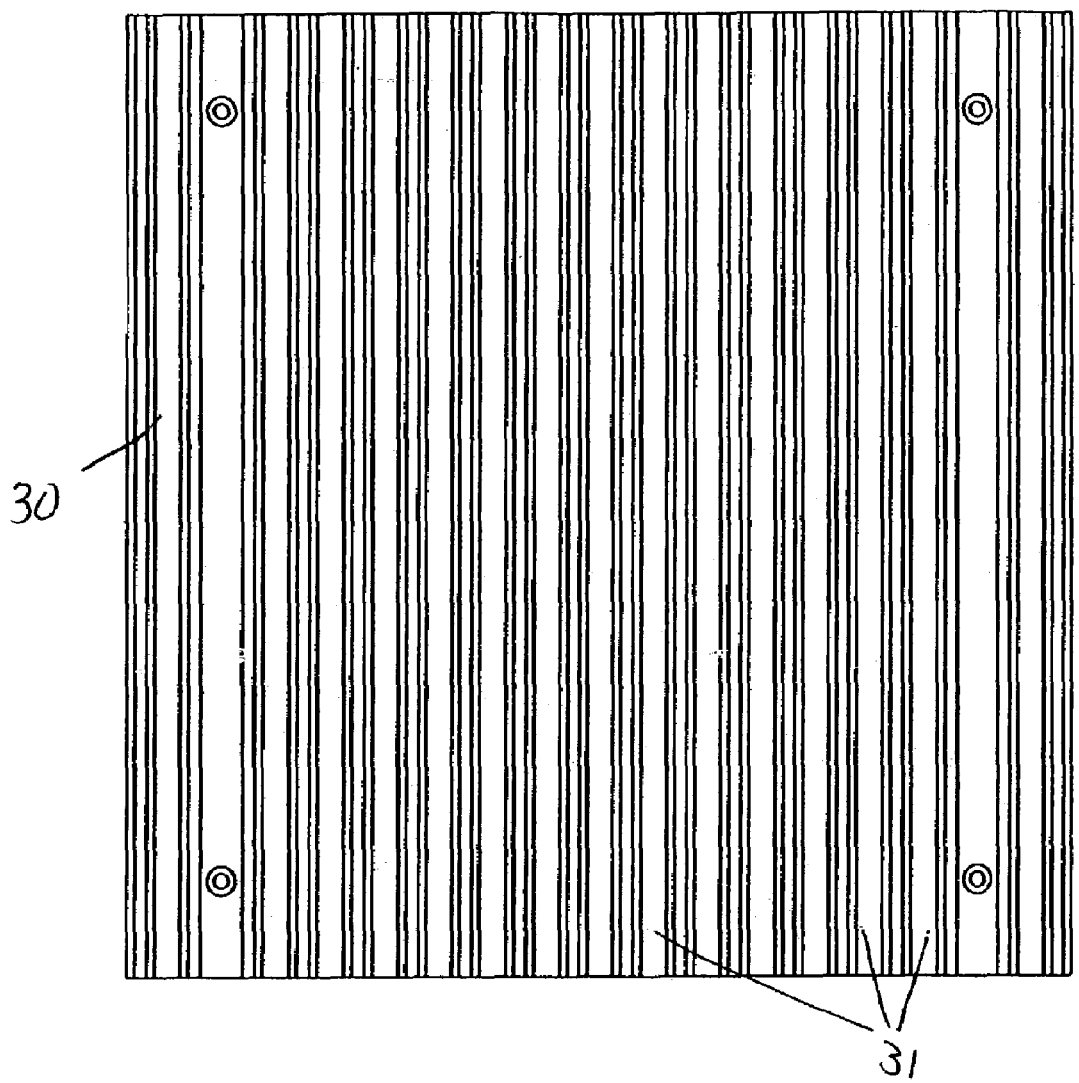
Figure 6:
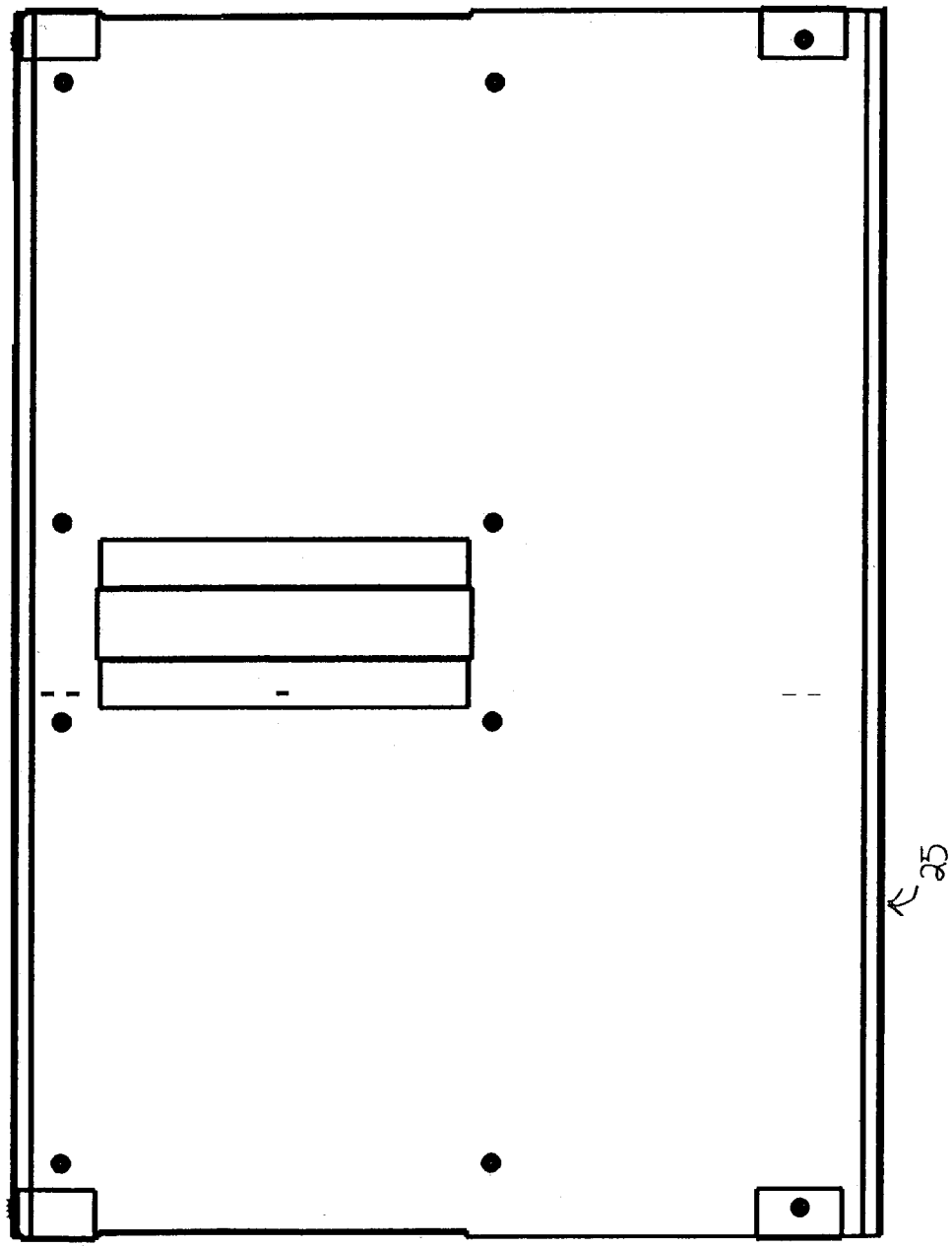
Figure 7:
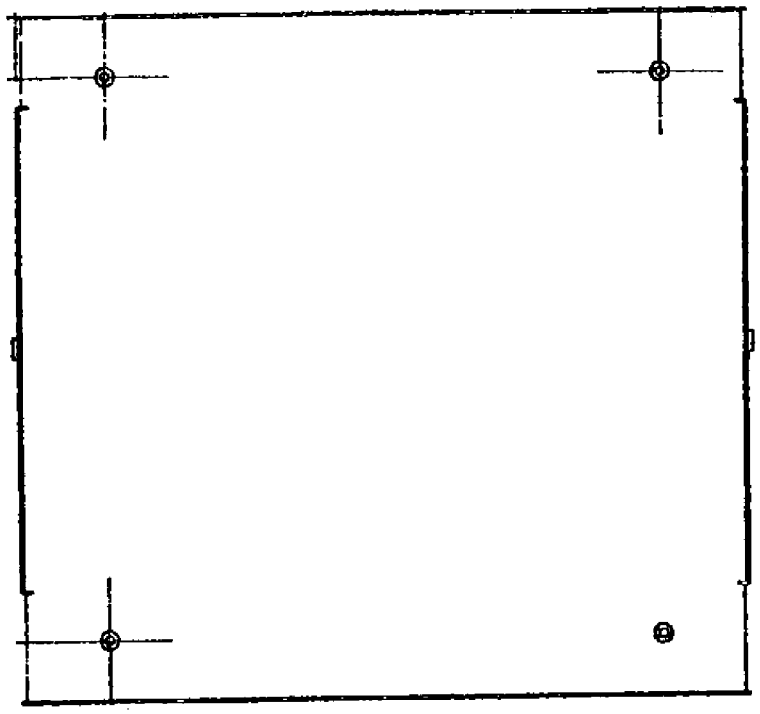
Figure 8:
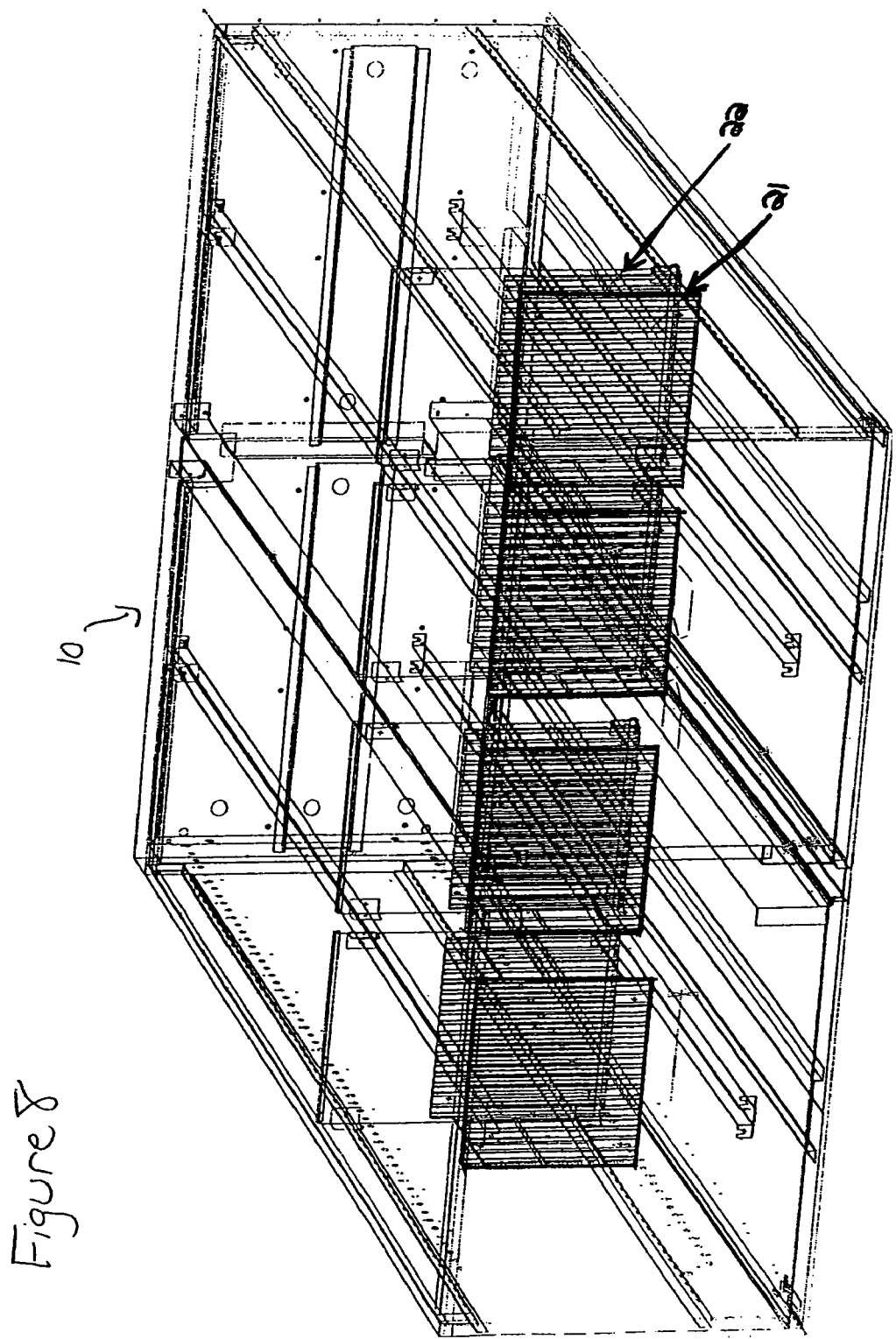
Figure 9:
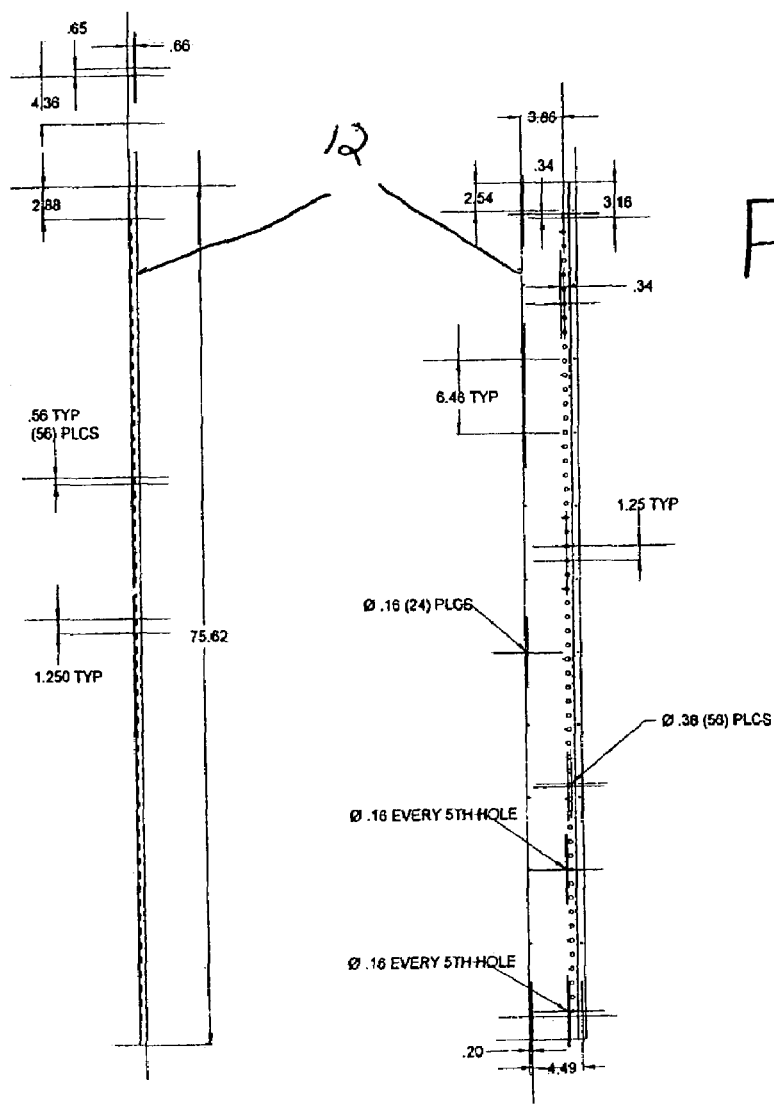
Figure 10:
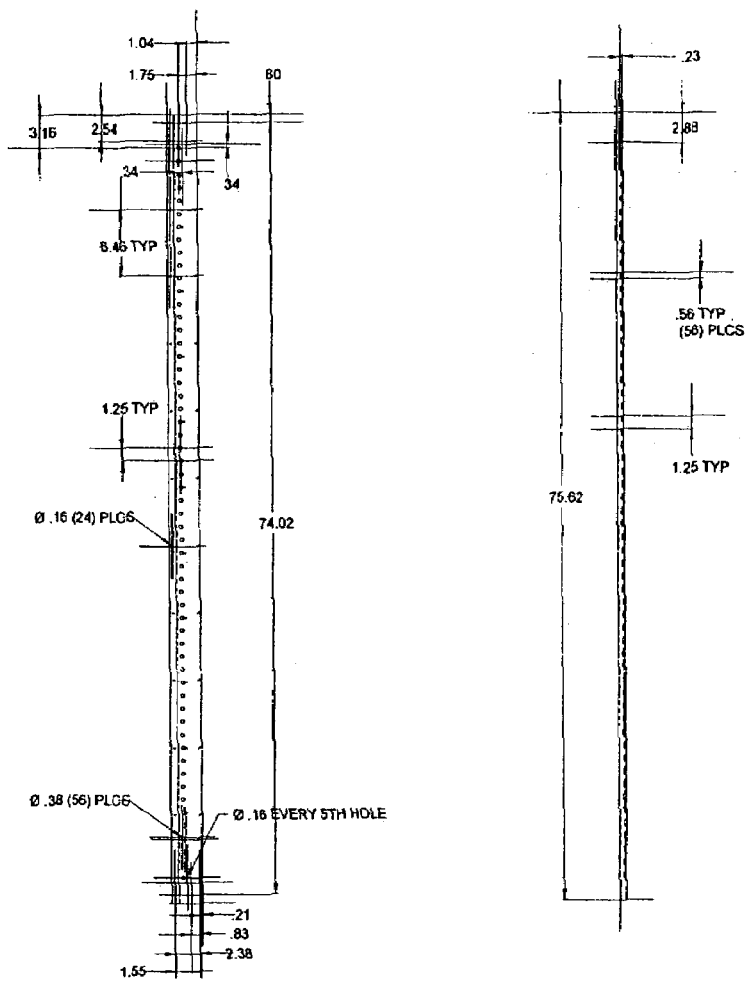
Figure 11:
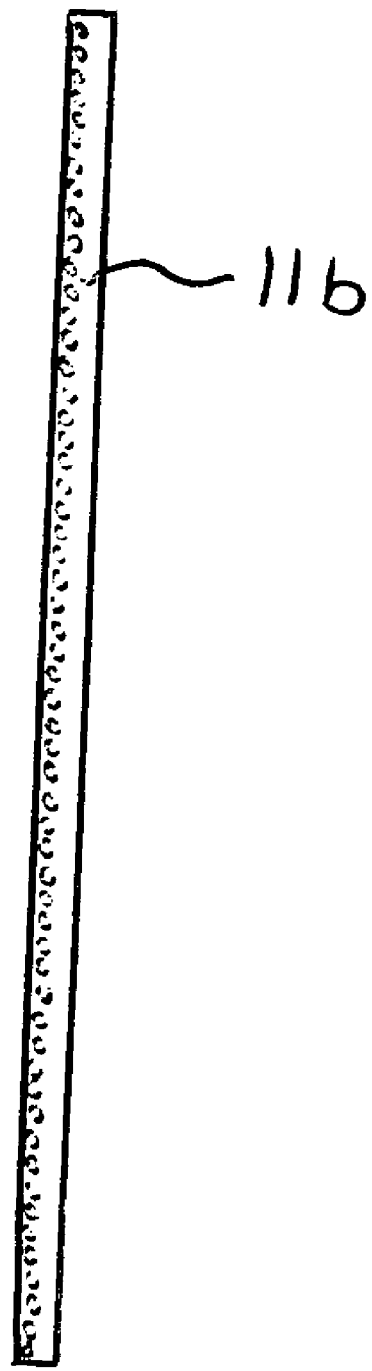
Figure 12:
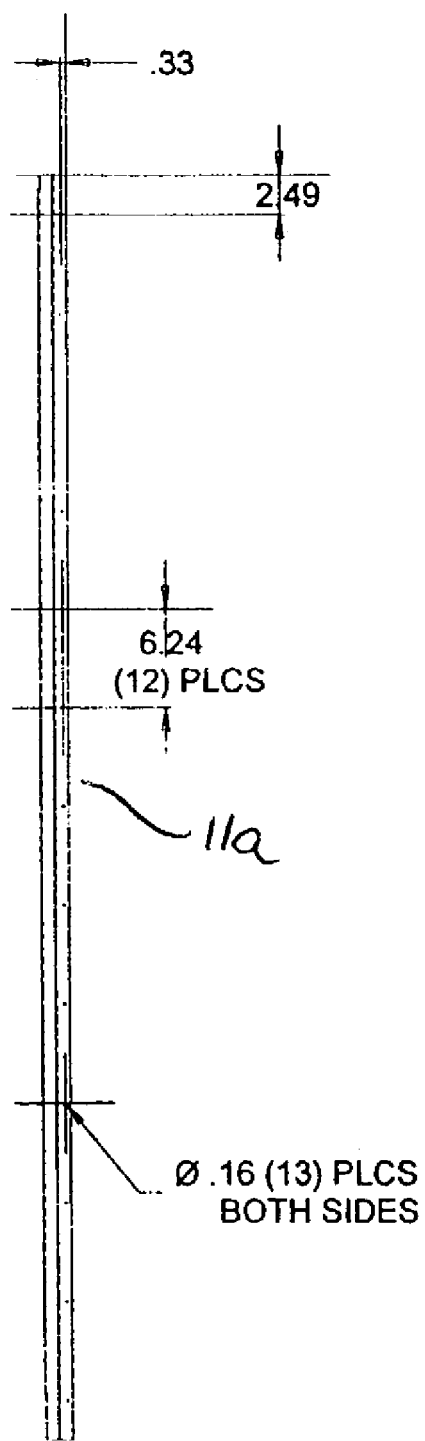
Figure 13:
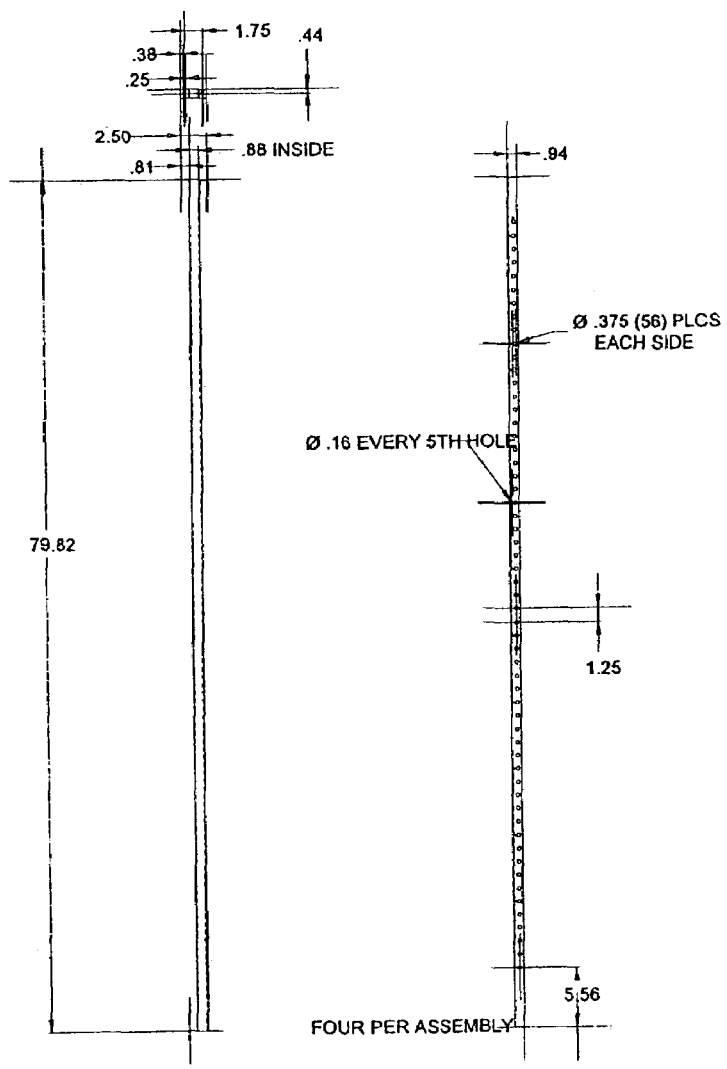
Figure 14:
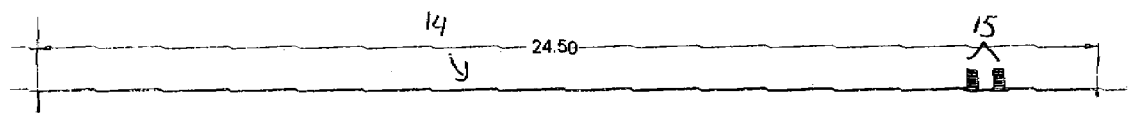
Figure 15:
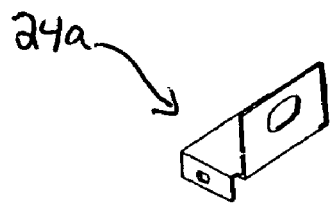
Figure 16:
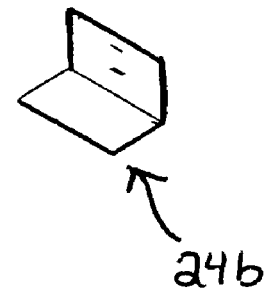
Figure 17:
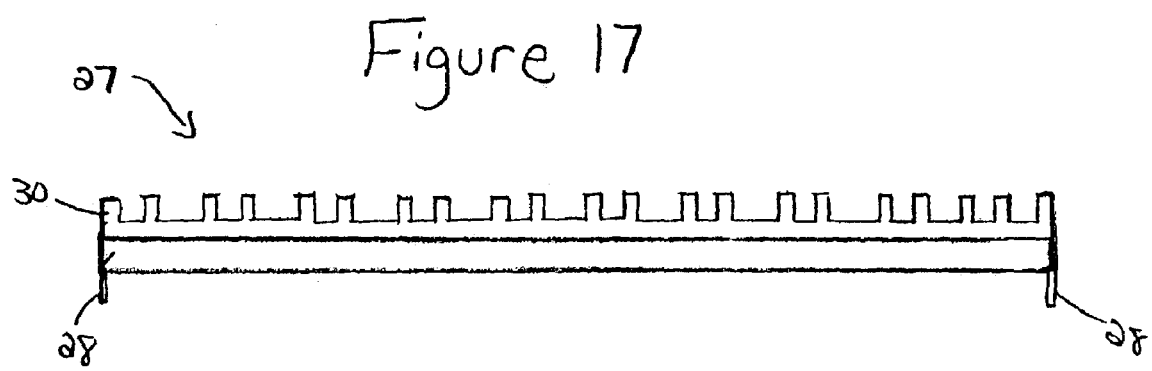
Figure 18:
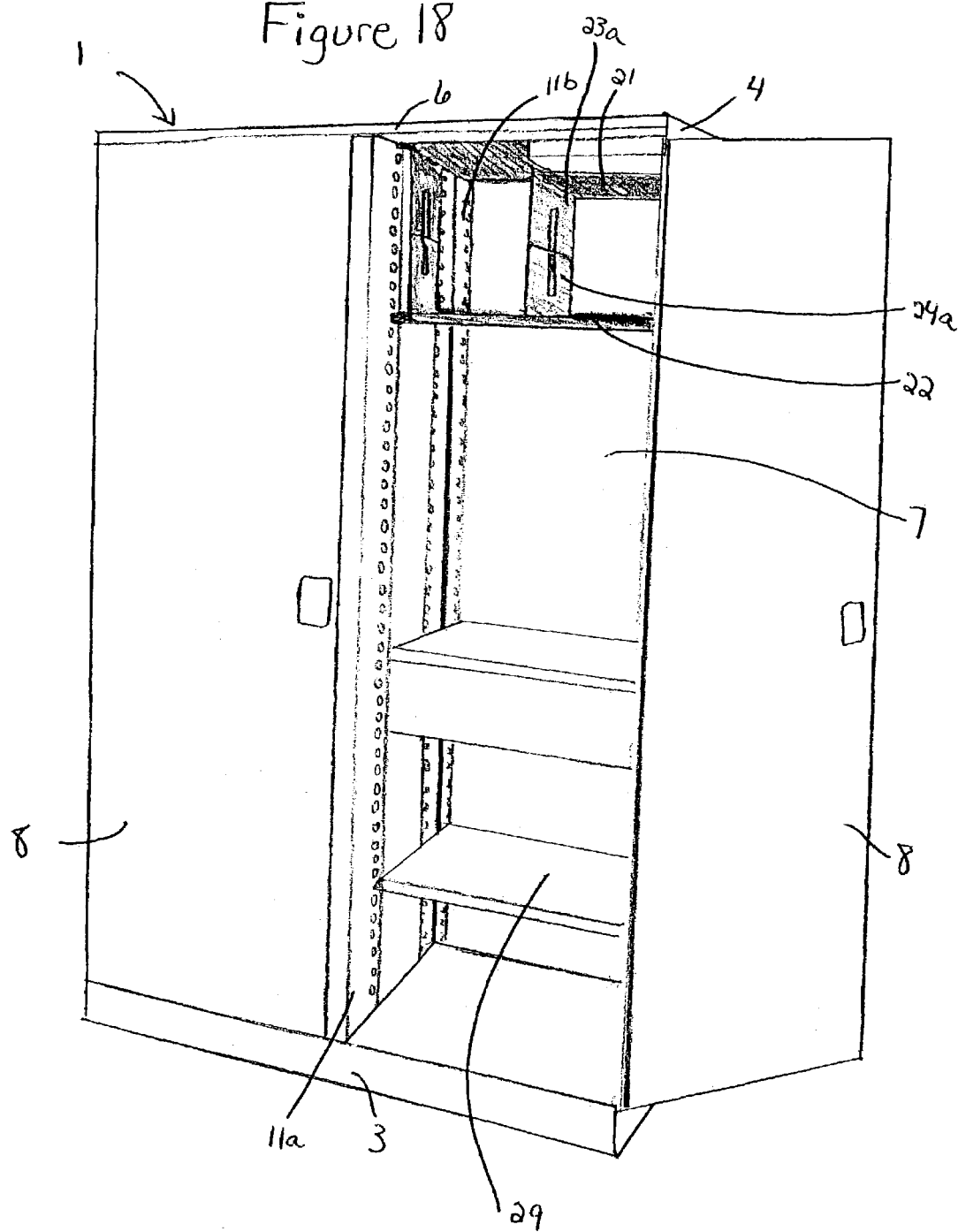
Figure 19A:
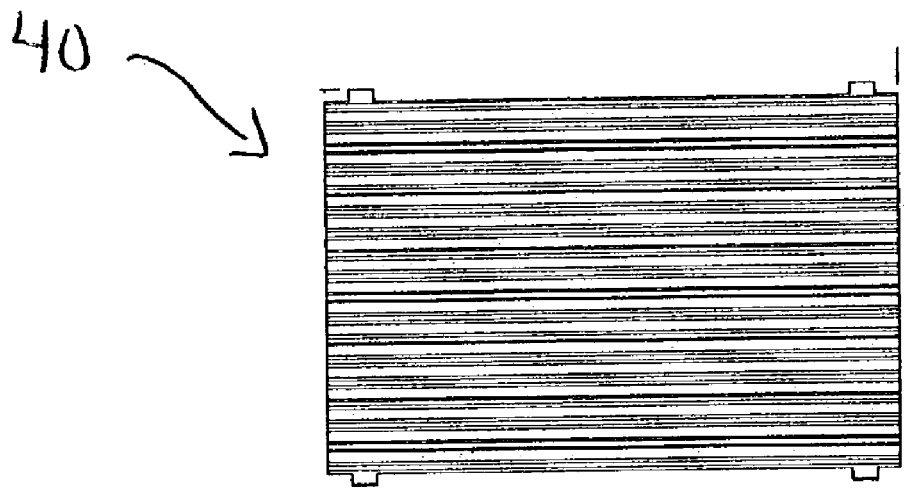
Figure 19B:
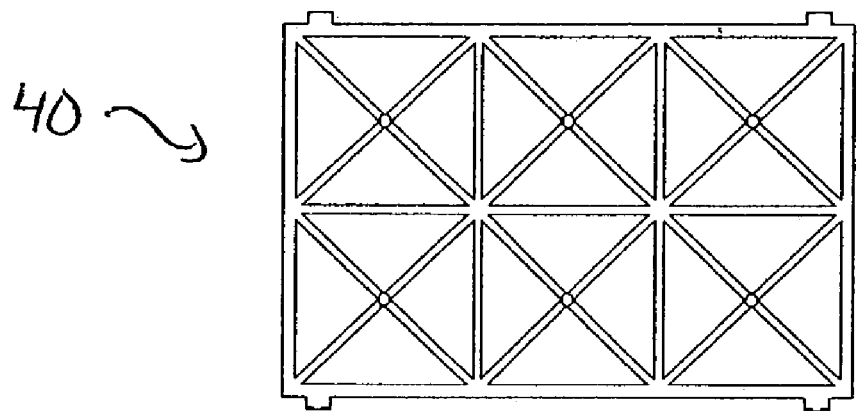

In the Figures:
FIG. 1 is a schematic view of a standard shelf assembly.
FIG. 2 is a side view of as standard shelf assembly.
FIG. 3 is a front view of the side panel of a standard shelf assembly.
FIG. 4 is a side view of the side panel of a standard shelf assembly.
FIG. 5 is a top view of a grooved static dissipative lining attached to a shelf section.
FIG. 6 is a top view of a double-wide bottom shelf section.
FIG. 7 is a top view of a top shelf used with a double-wide bottom shelf section.
FIG. 8 is a schematic view of a fully assembled anti-static storage cabinet.
FIG. 9 is a schematic view of a front shelf support.
FIG. 10 is a schematic view of a back shelf support.
FIG. 11 is a schematic view of a back grounding post.
FIG. 12 is a schematic view of a front grounding post.
FIG. 13 is a schematic view of a small grounding post.
FIG. 14 is a schematic view of a grounding strip.
FIG. 15 is a schematic view of a front shelf bracket.
FIG. 16 is a schematic view of a back shelf bracket.
FIG. 17 is a schematic view of an optional shelf.
FIG. 18 is a schematic view of an upright fully assembled anti-static storage cabinet.
FIG. 19a is a top view of an all plastic shelf assembly.
FIG. 19b is a bottom view of an all plastic shelf assembly.

SUMMARY OF INVENTION

The present invention is directed to an anti-static storage assembly including a shelf, grounding system, and cabinet for safe storage of circuit boards. The shelf is made of metal and includes a top shelf section and a bottom shelf section that are adjustable when the shelf is not mounted in the cabinet. Each shelf mounted in the cabinet is independent of any other shelf in the cabinet.

The interior of each shelf is lined with a static dissipative plastic lining having grooves for receiving circuit boards. The shelf is mounted to shelf supports, which are part of a greater grounding system including grounding posts, shelf supports, grounding strips, and grounding studs. The grounding system in conjunction with the metal shelf creates a system of very uniform conductivity that is increased with the addition of every shelf. The grounding system is independent from the storage cabinet therefore the grounding system can be constructed without the storage cabinet, and the cabinet can be made of any desired material.

The shelf can include a doublewide bottom section for increased holding capacity and can include a shelf extension. An optional lined shelf assembly is also disclosed that cannot be assembled to its desired height prior to installment into the cabinet. Instead, optional shelf assembly is installed in the cabinet in order to be adjusted to the proper circuit board height.

DETAILED DESCRIPTION OF INVENTION

As shown in FIG. 1, the anti-static shelf assembly of the present invention includes a top shelf section 21 and a bottom shelf section 22, each having a front, a back, two sides, and a first flat surface and a second flat surface. Each shelf section 21 and 22 also includes two side extensions 23a, 23b, 24a, and 24b. Side extensions 23a and 23b extend perpendicularly downward from each side of top shelf 21, and side extensions 24a and 24b extend perpendicularly upward from each side of bottom shelf 22, as indicated in FIGS. 1 and 2. Top shelf section 21 and bottom shelf section 22 are adjoined by connecting side extensions 23a and 23b to side extensions 24a and 24b respectively. When the shelf is assembled, side extensions 23a and 23b are in adjacent parallel relation to side extensions 24a and 24b respectively and connected by an adjustable connecting mechanism. The adjustable connecting mechanism is preferably a screw mechanism, preferably a screw and pem nut combination, as shown in FIGS. 3 and 4. Shelf assembly 20 can be adjusted as needed within the limits of the connection means. In the preferred embodiment, shelf assembly 20 is about 12 inches wide and can be adjusted in height to accommodate circuit boards ranging in size from about 5.5 inches to about 11 inches.

The present invention also preferably includes shelf extensions 26a and 26b, which increases the height of the shelf assembly to accommodate circuit boards from about 11 inches to about 21 inches. Shelf extension 26a is connected between side extensions 23a and 24a, whereas shelf extension 26b is connected between side extensions 23b and 24b. Shelf extensions 26a and 26b are connected to the side extensions using a screw mechanism, preferably a screw and pem nut combination; however, any reasonable connection means could be used. Shelf extensions 26a and 26b are made of metal, preferably stainless steel.

As shown in FIG. 5, one flat surface of each shelf section is lined with a static dissipative lining 30. The lined flat surface of top shelf section 21 faces the lined flat surface of bottom shelf section 22, thereby creating a shelf assembly having top and bottom interior lined sections. Static dissipative lining 30 is preferably composed of a plastic material and is attached to the metal shelf sections, preferably by screws. The static dissipative plastic material used to line the shelf has a range of dissipation from $10_6$–$10_9$ meg ohm. Further, this static dissipative plastic contains no glass, and, therefore provides a very uniform dissipation surface. This plastic is not very strong, rigid, or stiff; therefore, the strength of the shelf is supplied by the metal, which comprises the shelf to which the plastic lining is attached. Every part of shelf assembly 20 is preferably made of stainless steel. Also, as shown in FIG. 5, static dissipative plastic lining 30 preferably includes holding grooves 31 for securing in place circuit boards held by the shelf assembly 20. Holding grooves 31 can be of any design that will securely hold a circuit board.

In a preferred embodiment of the present invention, shelf assembly 20 includes a double-wide bottom shelf section 25 used in conjunction with two independent top shelf sections 21. Double-wide bottom section 25 is shown in FIG. 6 and an independent top shelf section 21 is shown in FIG. 7. Double-wide bottom section 25 is essentially twice the width of a standard bottom shelf section 22, making the double-wide shelf section about 24 inches wide. The assembly using a double-wide bottom shelf section is the same as the assembly of the standard shelf assembly 20 disclosed above. Each top shelf section 21 used with the double-wide bottom shelf section 25 is independently connected to double-wide 25 and is independently adjustable.

Alternatively, anti-static shelf assembly 20 is comprised of an all-plastic shelf 40 as shown in FIG. 19. All plastic shelf 40 includes the shelf structure and the static dissipative lining in one plastic unit having a first flat surface and a second flat surface. The first flat surface bears a grooved configuration as shown in FIG. 19a for receiving circuit boards while the second flat surface bears a reinforcement configuration for supporting the shelf as shown in FIG. 19b. One side of the shelf 40 includes an attachment mechanism for attaching the shelf to a cabinet or grounding system. The all plastic shelves 40 support circuit boards by being arranged so that the first flat surface of each of two parallel plastic shelves are facing one another. In this configuration, the grooves hold the circuit boards in place. The plastic shelf 40 is preferably made of a plastic free of glass filler. The glass-free plastic shelf 40 provides very uniform static dissipation rates and strength with less weight.

Anti-static shelf assembly 20 is structured for installation into a grounding system 10 of a storage cabinet 1, as shown in FIG. 8. The cabinet 1 shown in FIG. 18 basically consists of a housing 2 that includes a base 3, a first side panel 4, a second side panel 5, a top panel 6, a rear panel 7, and at least one front door 8. The grounding system includes a front grounding post 11a and back grounding post 11b, shelf supports 12, grounding strips 13, and grounding studs 14. Each component of the grounding system is shown in FIGS. 9–14. The entire grounding system is preferably made of stainless steel.

The grounding system 10 is oriented inside housing 2 such that front grounding post 11a extends from base 3 to top panel 6 in the front middle portion of cabinet 1. Shelf supports 12 shown in FIGS. 9 and 10 extend from front post 11a shown in FIG. 12 into the interior of cabinet 1. Back grounding post 11b shown in FIG. 11 extends from base 3 to top panel 6 in the back middle portion of cabinet 1. Back grounding post 11b includes holes permitting the post to serve as shelf supports 12. Grounding system 10 also preferably contains four more shelf supports 12 located in each of the four corners of cabinet 1, two of which are preferably attached to first side panel 4 and two of which are attached to second side panel 5. Each shelf support 12 includes holes for mounting shelves. These holes preferably extend the entire length of the shelf support to allow for numerous variations of shelf placement. Each shelf 20 is connected to shelf supports 12 using shelf brackets 24a and 24b, shown in FIGS. 15 and 16. Each shelf preferably uses four shelf brackets. Each shelf is adjusted to its desired height as disclosed above and each shelf bracket corresponds to a hole in each shelf support 12.

Grounding strips 14 connect the posts and shelf supports to each other, preferably by extending along the perimeter of the base of the cabinet. Grounding studs 15 are attached to the grounding system, thereby connecting the grounding system to the ground of the building in which the cabinet is located.

The stainless steel grounding system 10 is housed in a storage cabinet, but is not dependent on the storage cabinet housing for grounding. The cabinet can be made of any material desired, metal, wood, plastic, rubber, and still the shelves installed in the cabinet would be grounded by the independent grounding system. In theory, the grounding system and shelves can be used alone without a cabinet. With the shelves as disclosed above being made of metal, each addition of a shelf adds to the conductivity of the grounding system as each shelf is added. Every metal shelf added leads to more conductive pathways for the grounding system. Particularly, as each shelf is added to the shelf supports, four new points of contact and a new electrical pathway is added to the grounding system.

Since the grounding system is independent from the cabinet, the cabinet does not have to be assembled with the grounding system. This allows the cabinet to be built in pieces: base, sides, top, back, and doors. Each piece of the cabinet can be painted separately after its assembly without interfering with the grounding system. The grounding system is then attached to the cabinet housing using rivets and grounding strips.

In a preferred embodiment, an optional shelf assembly 27, as shown in FIG. 17, is also available for holding circuit boards. This optional shelf assembly 27 includes two metal shelf sections having a static dissipative liner 30 lining one side of each. The metal sections can be sheets comprising the entire length of the shelf as shown in FIG. 17 with the liner 30 covering each sheet. Alternatively, the metal sections can be metal strips that serve as supports for the liner 30. Optional shelf assembly 27 is preferably about 12 inches wide. This optional shelf assembly cannot be assembled to its desired height prior to installment into the cabinet. Instead, optional shelf assembly 27 is installed in the cabinet in order to be adjusted to the proper circuit board height. One shelf section is placed lined side up in a stationary position in the cabinet and affixed by screws to the shelf supports. A second shelf section is placed lined side down into position at the proper height to accommodate the desired circuit board. This second shelf section is adjustable by a vertical ob-round slot in the shelf clips 28 that extend from the second shelf section and attach the shelf section to the shelf supports 12. This process can be repeated throughout the cabinet at any desired location with as much space between the sets of shelves as desired. Just as with the standard shelf assembly disclosed above, the height of each optional shelf assembly is independent of any other shelf assembly within a cabinet.

In another preferred embodiment, cabinet 1 also includes a second optional shelf 29 connected to shelf supports 12 for storing circuit boards in original packaging or other desired items. Second optional shelf 29 is preferably about 24 inches wide. This second optional shelf 29 is illustrated in FIG. 18 and includes simply a metal shelf unit painted with a static dissipative paint. This coating of static dissipative paint reduces the risk of static discharge within the cabinet. Also available are individual drawers, preferably lockable, in a number of different depths to create a storage area.

The shelves and cabinet disclosed above can be assembled with any combination of standard shelf assemblies, optional shelf assemblies, or drawers as desired by the user and permitted within the confines of the housing.

What is claimed is:

1. An anti-static storage assembly for storing circuit boards comprising:
    at least one shelf unit comprised of a top shelf section and a bottom shelf section, each of said sections having a front, a back, two sides, a first flat surface and a second flat surface, and a static dissipative material adjoined to at least said second flat surface of said top shelf section and said first flat surface of said bottom shelf section; and
    a grounding system configured to receive said at least one shelving unit, said grounding system being comprised of at least one front grounding post, at least one back grounding post, and a plurality of shelf supports connected by a plurality of grounding strips and grounded by a plurality of grounding studs;
    wherein said at least one shelf unit is mounted to said plurality of shelf supports of said grounding system, said top shelf section of said shelf unit mounted a distance above and in parallel relation to said bottom shelf section, wherein said second flat surface of said top shelf section faces said first flat surface of said bottom shelf section;
    wherein said static dissipative material of said second flat surface of said top shelf and said first flat surface of said bottom shelf of said shelf unit include a plurality of holding grooves; and
    wherein at least one circuit board is received by said plurality of holding grooves and held in a secure position between said top shelf section and said bottom shelf section of said shelf unit.

2. The anti-static storage assembly of claim 1, wherein each at least one shelf unit is independent of any other at least one shelf unit within said storage assembly.

3. The anti-static storage assembly of claim 1, wherein said static dissipative material is a plastic.

4. The anti-static storage assembly of claim 1, wherein said grounding system is a free-standing structure.

5. The anti-static storage assembly of claim 1, wherein said grounding system is comprised of stainless steel.

6. The anti-static storage assembly of claim 1, wherein said grounding system is housed within a cabinet.

7. The anti-static storage assembly of claim 6, wherein grounding function of said grounding system is independent of said cabinet.

8. The anti-static storage assembly of claim 1, wherein each of said plurality of shelf supports includes a plurality of mounting holes extending the entire length of each of said shelf supports, thereby allowing for numerous variations of shelf placement.

9. The anti-static storage assembly of claim 1, wherein said top shelf section and said bottom shelf section of said shelf unit are comprised of a metal.

10. The anti-static storage assembly of claim 9, wherein said at least one shelf unit is positionable to receive a circuit board prior to mounting to said grounding system.

11. The anti-static storage assembly of claim 10, wherein said top shelf section includes at least one side extension extending perpendicularly downward from each of said two sides, and said bottom shelf section includes at least one side extension extending perpendicularly upward from each of said two sides, thereby providing a mechanism for connecting said top shelf section and said bottom shelf section.

12. The anti-static storage assembly of claim 9, wherein the addition of each metal shelf increases the conductivity of said grounding system.

13. The anti-static storage assembly of claim 1, wherein said top shelf section and said bottom shelf section of said shelf unit are comprised of a glass-free static dissipative plastic.

14. The anti-static storage assembly of claim 13, wherein said static dissipative material is continuously adjoined to at least said second flat surface of said top shelf section and said first flat surface of said bottom shelf section.

15. The anti-static storage assembly of claim 13, wherein said first flat surface of said top shelf section and said second flat surface of said bottom shelf section bears a shelf reinforcement configuration.

16. The anti-static storage assembly of claim 13, wherein said first flat surface of said top shelf section and said second flat surface of said bottom shelf section bears at least one metal strip spanning a depth of said top shelf section and said bottom shelf section.

17. The anti-static storage assembly of claim 1, further comprising a groove-free metal shelf unit coated with a static dissipative paint.

18. An anti-static shelf unit for storing circuit boards comprising:
    a top shelf section and a bottom shelf section, each of said sections having a front, a back, two sides, and a first flat surface and a second flat surface;
    at least one side extension extending perpendicularly downward from each of said two sides of said top shelf section
    at least one side extension extending perpendicularly upward from each of said two sides of said bottom shelf section; and a static dissipative liner coating said second flat surface of said top shelf section and said first flat surface of said bottom shelf section;

wherein said top shelf section of said shelf unit configured a distance above and in parallel relation to said bottom shelf section, wherein said second flat surface of said top shelf section faces said first flat surface of said bottom shelf section, and wherein each of said downward extending side extensions of said top shelf fall adjacent to each of said upward extending side extensions of said bottom shelf;

wherein, said top shelf section and bottom shelf section are adjoined by connecting said adjacent side extensions with an adjustable fastening mechanism;

wherein said static dissipative lining on each of said second flat surface of said top shelf section and said first flat surface of said bottom shelf section includes a plurality of holding grooves;

wherein at least one circuit board is received by said plurality of holding grooves and held in a secure position between said top shelf section and said bottom shelf section of said shelf unit.

19. The anti-static shelf unit of claim 18 wherein said unit is comprised of a metal.

20. The anti-static shelf unit of claim 18 wherein at least one circuit board can be secured within said shelf unit prior to mounting said shelf unit to a storage facility.

21. The anti-static shelf unit of claim 18 wherein said shelf unit is about 12 inches in width and can accommodate circuit boards ranging in size from about 5.5 inches to about 11 inches.

22. The anti-static shelf unit of claim 18, further comprising two shelf extensions, each of said shelf extensions extending between and connected to the adjacent side extensions corresponding to each of said two sides of said top and bottom shelf sections.

23. The anti-static shelf unit of claim 22, wherein said shelf extensions allows the shelf unit to accommodate circuit boards ranging in size from about 11 inches to about 21 inches.

24. The anti-static shelf unit of claim 18, further comprising a double-width bottom shelf used in conjunction with two corresponding standard-width top shelf sections.

25. An anti-static shelf unit for storing circuit boards comprising:
   a glass-free, static dissipative plastic top shelf section and a glass-free, static dissipative plastic bottom shelf section, each of said sections having a front, a back, two sides, and a first flat surface and a second flat surface, said second flat surface of said top shelf section and said first flat surface of said bottom shelf section each including a plurality of holding grooves for receiving at least one circuit board, and said first flat surface of said top shelf section and said second flat surface of said bottom shelf section bearing a shelf reinforcement configuration; and
   an attachment mechanism for attaching said shelf unit to a storage facility;
   wherein said top shelf section of said shelf unit is configured a distance above and in parallel relation to said bottom shelf section, said grooved second flat surface of said top shelf section facing said grooved first flat surface of said bottom shelf section and said first flat surface of said top shelf section and said second flat surface of said bottom shelf section being without grooves; and
   wherein at least one circuit board is received by said plurality of holding grooves and held in a secure position between said second flat surface of said top shelf section and said first flat surface of said bottom shelf section of said shelf unit.

26. An anti-static shelf unit for storing circuit boards comprising:
   a top shelf section and a bottom shelf section, each of said sections having a front, a back, two sides, and a first flat surface and a second flat surface; and
   a static dissipative lining adjoined to at least said second flat surface of said top shelf section and first flat surface of said bottom shelf section;
   a plurality of holding grooves on each of said second flat surface of said top shelf section and said first flat surface of said bottom shelf section;
   wherein said top shelf section of said shelf unit is configured a distance above and in parallel relation to said bottom shelf selection, wherein said second flat surface of said top shelf section faces said first flat surface of said bottom shelf section;
   wherein at least one circuit board is received by said plurality of holding grooves and held in a secure position between said top shelf section and said bottom shelf section of said shelf unit within said plurality of holding grooves; and
   said first flat surface of said top shelf section and said second flat surface of said bottom shelf section are smooth to enable said shelf unit to be placed adjacent to another shelf unit.

27. The anti-static storage shelf of claim 26, further comprising at least two adjustable shelf clips extending from each of said two sides of each of said top shelf section and bottom shelf section.

28. The anti-static storage shelf of claim 27, wherein a height of said shelf unit is postionable upon mounting of said shelf unit with a circuit board into a cabinet.

* * * * *